(12) United States Patent
Higashiho et al.

(10) Patent No.: US 6,618,310 B2
(45) Date of Patent: Sep. 9, 2003

(54) SYNCHRONOUS SEMICONDUCTOR MEMORY DEVICE AND REFRESH METHOD THEREOF

(75) Inventors: Mitsuhiro Higashiho, Kasugai (JP); Hajime Sato, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/907,910

(22) Filed: Jul. 19, 2001

(65) Prior Publication Data

US 2002/0051396 A1 May 2, 2002

(30) Foreign Application Priority Data

Nov. 2, 2000 (JP) ........................................ 2000-335603

(51) Int. Cl.[7] ................................................ G11C 7/00
(52) U.S. Cl. ...................................... 365/222; 365/233
(58) Field of Search ............................... 365/222, 233, 365/189.01, 230.01

(56) References Cited

U.S. PATENT DOCUMENTS

| 5,495,452 | A |   | 2/1996  | Cha      |           |
|-----------|---|---|---------|----------|-----------|
| 5,805,524 | A | * | 9/1998  | Kotani et al. | 365/189.01 |
| 5,828,619 | A | * | 10/1998 | Hirano et al. | 365/222 |
| 6,335,565 | B1 | * | 1/2002 | Miyamoto et al. | 257/676 |

FOREIGN PATENT DOCUMENTS

| JP | 5-217369   | 8/1993  |
| JP | 5-307883   | 11/1993 |
| JP | 6-021776   | 1/1994  |
| JP | 7-73668    | 3/1995  |
| JP | 11-031383  | 2/1999  |

\* cited by examiner

*Primary Examiner*—Hoai Ho
(74) *Attorney, Agent, or Firm*—Arent Fox Kintner Plotkin Kahn, PLLC

(57) ABSTRACT

In a synchronous semiconductor memory device which provides the refresh cycle optimum for charge retention characteristics without being influenced by production variations, and without requiring much test time to measure characteristics before adjustment of the refresh time, and enables reduction of current consumption in a refresh operation, an output signal from an active pointer circuit which is a phase comparison signal from a DLL circuit is output as a digital signal, and the digital signal is converted by a D/A converter circuit to an analog signal for determining the current value of a constant current circuit, and then, in a measured cycle modification circuit constituting the constant current circuit, the current value responsive to the voltage value of this analog signal is set as the driving current of an oscillation circuit which is a refresh cycle measurement circuit so as to control a driving capability, thereby an oscillation signal for self-refreshing is output.

20 Claims, 12 Drawing Sheets

DIAGRAM ILLUSTRATING A SECOND PRINCIPLE OF THE INVENTION

DIAGRAM ILLUSTRATING A FIRST PRINCIPLE OF THE INVENTION

DIAGRAM ILLUSTRATING A SECOND PRINCIPLE OF THE INVENTION

DIAGRAM ILLUSTRATING A THIRD PRINCIPLE OF THE INVENTION

CIRCUIT BLOCK DIAGRAM ILLUSTRATING A REFRESH CYCLE SETTING CIRCUIT IN THE EMBODIMENT OF THE INVENTION

FIG. 5 CIRCUIT DIAGRAM ILLUSTRATING AN ACTIVE POINTER CIRCUIT IN THE EMBODIMENT OF THE INVENTION

OPERATING WAVE PATTERNS OF ACTIVE POINTER CIRCUIT

FIG. 7 CIRCUIT DIAGRAM ILLUSTRATING D/A CONVERTER CIRCUIT IN THE EMBODIMENT OF THE INVENTION

FIG. 8 CIRCUIT DIAGRAM ILLUSTRATING A REFRESH CYCLE CONTROL CIRCUIT IN THE EMBODIMENT OF THE INVENTION (A FIRST EXAMPLE)

CIRCUIT DIAGRAM ILLUSTRATING A SECOND EXAMPLE OF THE REFRESH CYCLE CONTROL CIRCUIT

CIRCUIT DIAGRAM ILLUSTRATING A THIRD EXAMPLE OF THE REFRESH CYCLE CONTROL CIRCUIT

CIRCUIT DIAGRAM ILLUSTRATING A FOURTH EXAMPLE OF THE REFRESH CYCLE CONTROL CIRCUIT

CIRCUIT BLOCK DIAGRAM ILLUSTRATING THE OTHER EXAMPLE OF A DLL CIRCUIT

FIG. 13 CIRCUIT DIAGRAM ILLUSTRATING A VOLTAGE CONTROL DELAY CIRCUIT IN THE OTHER EXAMPLE OF THE DLL CIRCUIT

CIRCUIT BLOCK DIAGRAM ILLUSTRATING AN EXAMPLE OF A PLL CIRCUIT

SYNCHRONOUS SEMICONDUCTOR MEMORY DEVICE AND REFRESH METHOD THEREOF

BACKGROUND OF THE INVENTION

1. Field of the Invention

The invention relates to a refresh operation in a synchronous semiconductor memory device, and more particularly to a synchronous semiconductor memory device, enabling reduction of current consumption in a self-refresh operation.

2. Description of Related Art

With the recent development in computer technology which realizes animations and other advanced features, there is a growing demand for increasing the capacity and speed of semiconductor memory devices represented by a dynamic random access memory (DRAM). To meet this demand, synchronous semiconductor memory devices, represented by a large-capacity synchronous DRAM, have been developed. On the other hand, this demand necessarily results in an increase in current consumption in a circuit operation, so that it is desired to reduce current consumption in a synchronous semiconductor memory device.

Particularly, a refresh operation of memory cells in a memory device such as a synchronous DRAM needs to be performed in a predetermined cycle. Therefore, current consumption in a refresh operation have been reduced by setting the refresh cycle long in accordance with the actual performance value of charge retention time determined based on charge retention characteristics.

In addition, since a synchronous semiconductor memory device operates in synchronization with an external basic clock, device temperature rises as operating current is increased due to an increase in the speed of the external basic clock. Because charge retention characteristics of memory cells largely depend on the device temperature, charge retention time is decreased as the temperature rises. Therefore, it is necessary to shorten the refresh cycle in a high temperature range, and to set the refresh cycle suitable for the device temperature which changes according to the frequency of the external basic clock.

With regard to conventional arts, for example, the Japanese Laid-Open Patent Publication No.5-217369 describes a refresh timer that outputs a refresh signal in a semiconductor memory device requiring a refresh operation of memory cells, comprising oscillation circuit for outputting an oscillation signal of predetermined frequency, frequency division circuit for dividing frequency of the oscillation signal, and adjustment circuit for adjusting the frequency division cycle of the frequency division circuit to the value suitable as the refresh cycle of the memory cells.

In the aforementioned refresh timer in the semiconductor memory device, the refresh cycle can be adjusted to the accurate refresh cycle required for each device after production, even when oscillation circuit with relatively poor accuracy is used.

The Japanese Laid-Open Patent Publication No.5-307883 discloses an oscillator circuit, comprising inverter circuits between a high-potential power line and a low-potential power line in which predetermined number of PMOS transistors and NMOS transistors are connected in series; first resistance circuit between the high-potential power line and the low-potential power line in which a first PMOS transistor for inputting to gates the potential level of the low-potential power source line and a resistor are sequentially connected in series, and a contact between the first PMOS transistor and the resistor is a low-potential output end; and second resistance circuit between the high-potential power source line and the low-potential power line in which a resistor and a first NMOS transistor for inputting to gates the potential level of the high-potential power source line are sequentially connected in series, and a contact between the resistor and the first NMOS transistor is an high-potential output end, wherein the low-potential output end of the first resistance circuit is connected with the gates of the PMOS transistors in the inverter circuits proximate to the high-potential power source line, and the high-potential output end of the second resistance circuit is connected with the gates of the NMOS transistors in the inverter circuits proximate to the low-potential power source line, and the inverter circuits are multi-stage connected in a loop-shape to generate a predetermined clock cycle.

Since the charge retention time of memory cells in a semiconductor memory device is decreased as the device temperature rises, the temperature characteristics of the refresh cycle should be set to have a negative correlation to the device temperature in order to retain charge. In view of this, in the aforementioned oscillator circuit, the temperature characteristics of the oscillation cycle are set to have the negative correlation to the device temperature just as the temperature characteristics of the refresh cycle for retaining charge, and thus the refresh cycle is shortened as the device temperature rises. In this way, the reliability with which the memory cells retain charge at high temperatures is enhanced. In addition, since the refresh cycle can be set long at normal working temperatures, the operating current for a refresh operation can be prevented from increasing. Accordingly, current consumption can be reduced.

Furthermore, the Japanese Laid-Open Patent Publication No.7-73668 describes a self-refresh cycle adjustment circuit in a semiconductor memory device which generates a master clock signal for setting the refresh cycle in a semiconductor memory device. This self-refresh cycle adjustment circuit comprises pulse train generation circuit for generating pulse trains in a predetermined cycle according to the refresh mode set by an external control signal, and dividing frequency of the pulse trains sequentially to output a number of frequency-divided pulse trains each of which has a different cycle; at least one temperature detection circuit for detecting change in surrounding temperature based on the internally-set standard level to output a temperature detection signal; and master clock generation circuit for selecting one of the frequency-divided pulse trains according to the temperature detection signal and outputting a master clock signal based on the selected frequency-divided pulse train.

In the aforementioned self-refresh cycle adjustment circuit, the self-refresh cycle can be actively adjusted according to change in surrounding temperature. Furthermore, the self-refresh cycle can be automatically adjusted so as to be adapted to various operating environments.

In the refresh timer described in the Japanese Laid-Open Patent Publication No.5-217369, the refresh cycle can be accurately adjusted to the refresh cycle required for each semiconductor memory device after production, even when oscillation circuit with relatively poor accuracy is used.

However, this adjustment needs to be made to each semiconductor memory device using adjustment circuit such as a trimming circuit, and the optimum refresh cycle cannot be determined without measuring variations in characteristics of each device due to production variations. Since characteristics to be measured include temperature characteristics, much test time is required to measure characteristics before adjustment, resulting in a problem that productivity of semiconductor devices cannot be improved.

Furthermore, when the refresh cycle is adjusted using adjustment circuit such as a trimming circuit, a refresh operation is always performed in a constant cycle. Since this cycle needs to be set such that the memory cells can retain charge even under the most extreme conditions (for example, when power supply voltage is low, or temperature is high), a refresh operation is performed in a cycle shorter than that required based on charge retention characteristics of the memory cells under normal use conditions. This causes the problem that current consumption in a refresh operation becomes greater than necessary.

In the oscillator circuit disclosed in the Japanese Laid-Open Patent Publication No.5-307883, the self-refresh cycle is shortened as temperature rises to enhance the reliability with which the memory cells retain charge at high temperatures. At the same time, the self-refresh cycle is set long at normal working temperatures so as to reduce current consumption. In the self-refresh cycle adjustment circuit described in the Japanese Laid-Open Patent Publication No.7-73668, the self-refresh cycle can be actively adjusted according to change in surrounding temperature.

However, due to production variations, there are variations in temperature characteristics of charge retention in memory cells, correlation characteristics of the self-refresh cycle to temperature in the oscillator circuit described in the Japanese Laid-Open Patent Publication No.5-307883, or detection characteristics of the temperature detection circuit described in the Japanese Laid-Open Patent Publication No.7-73668, and the variations in these characteristics are distributed within a predetermined range. The operating constant of the oscillator circuit or the temperature detection circuit needs to be set based on the worst condition, that is, the limit of the distribution range. Therefore, if production requirements are loosened to admit a wide distribution range of variations in characteristics, a refresh operation is performed in a refresh cycle shorter than that required based on the characteristics of a unit in the center of the distribution range. This causes the problem that current consumption in a refresh operation becomes greater than necessary. If the admissible distribution range of variations in characteristics is limited, load of production becomes great to keep variations in characteristics within the admissible distribution range, though current consumption reduction in a refresh operation can be realized.

SUMMARY OF THE INVENTION

Accordingly, it is an object of the invention to overcome the aforementioned problems of the conventional arts by providing a synchronous semiconductor memory device which provides the refresh cycle optimum for charge retention characteristics without being influenced by production variations, and without requiring much test time to measure characteristics before adjustment of the refresh time, and reduces current consumption in a refresh operation.

To achieve the aforementioned object, a synchronous semiconductor memory device requiring a refresh operation according to one aspect of the invention is configured so as to comprise detection circuit for detecting the frequency of an external basic clock, and cycle control circuit for controlling the refresh cycle based on a frequency detection signal from the detection circuit.

In the aforementioned synchronous semiconductor memory device, as shown in a diagram illustrating a first principle in FIG. 1, frequency detection circuit 1 receives an external basic clock CLK and outputs a frequency detection signal A according to the frequency of the external basic clock CLK. The frequency detection signal A is input to refresh cycle control circuit 2, which outputs a refresh signal OSC having the refresh cycle controlled based on the frequency detection signal A.

In addition, a refresh method of the synchronous semiconductor memory device requiring periodical refresh of memory cells according to another aspect of the invention comprises a detection process of detecting the frequency of an external basic clock and a cycle control process of controlling a refresh cycle based on a frequency detection signal from the detection process.

In the refresh method of the aforementioned synchronous semiconductor memory device, an external basic clock is received and a frequency detection signal responsive to the frequency of the external basic clock is output during the frequency detection process. The frequency detection signal is received and a refresh signal OSC having the refresh cycle controlled based on the frequency detection signal is output during the refresh cycle control process.

In this way, in the synchronous semiconductor memory device, the refresh cycle is set in accordance with the charge retention characteristics at each device temperature which changes according to the frequency of the external basic clock CLK. Therefore, it is not necessary to perform a test to measure temperature characteristics of charge retention in memory cells to set the refresh cycle for each synchronous semiconductor memory device.

In addition, it is not required to use temperature detection circuit whose accuracy is difficult to ensure due to production variations, and it is possible to use a stable signal, an external basic clock as a temperature sensor. Thus, the refresh cycle suitable for device temperature can be set easily without fail over, that is, the optimum refresh cycle can be realized over a full device temperature range, enabling reduction of current consumption.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

DETAILED DESCRIPTION OF PREFERRED EMBODIMENTS

Hereinafter, the embodiment of the present invention regarding a synchronous semiconductor memory device and a refresh method thereof will be described in detail with reference to the drawings.

Figure 1:
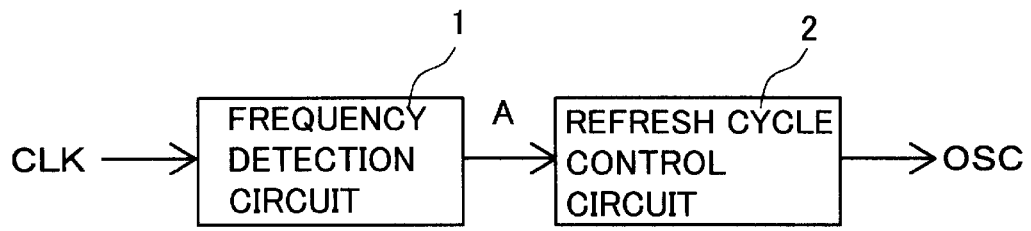
FIG. 1 is a diagram illustrating a first principle of the invention.
Figure 2:
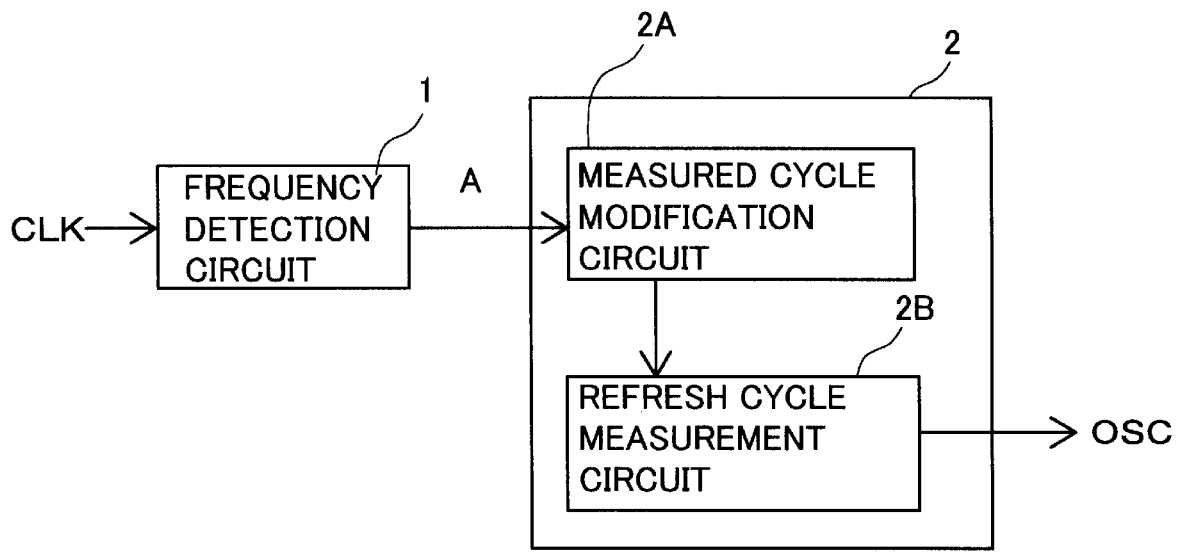
FIG. 2 is a diagram illustrating a second principle of the invention.
Figure 3:
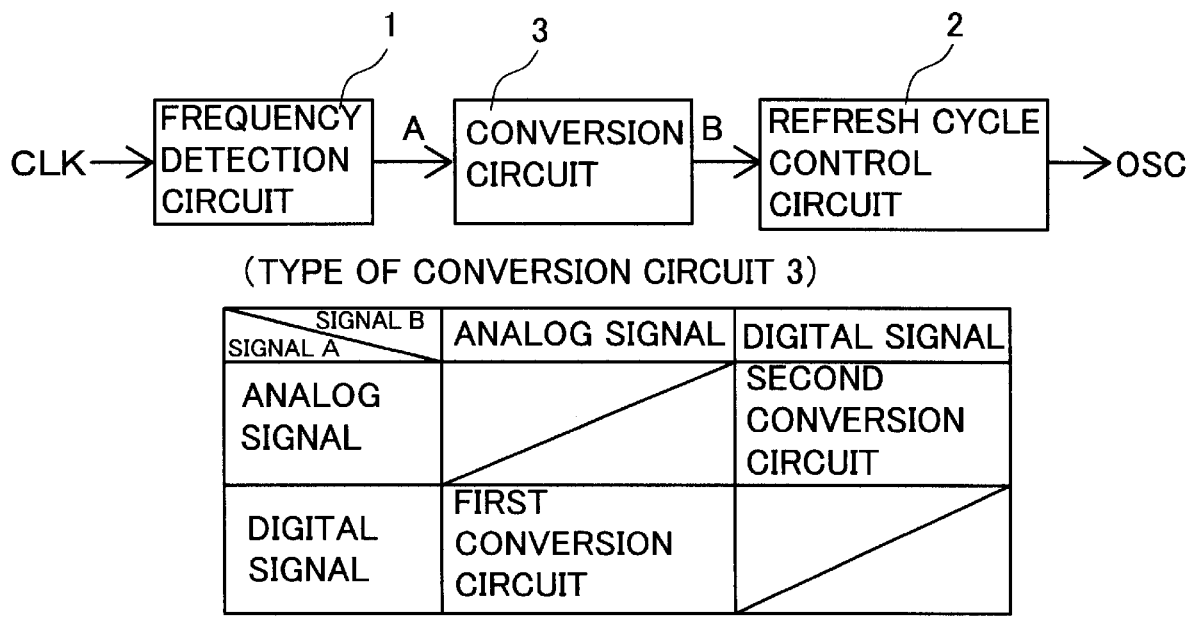
FIG. 3 is a diagram illustrating a third principle of the invention.
Figure 4:
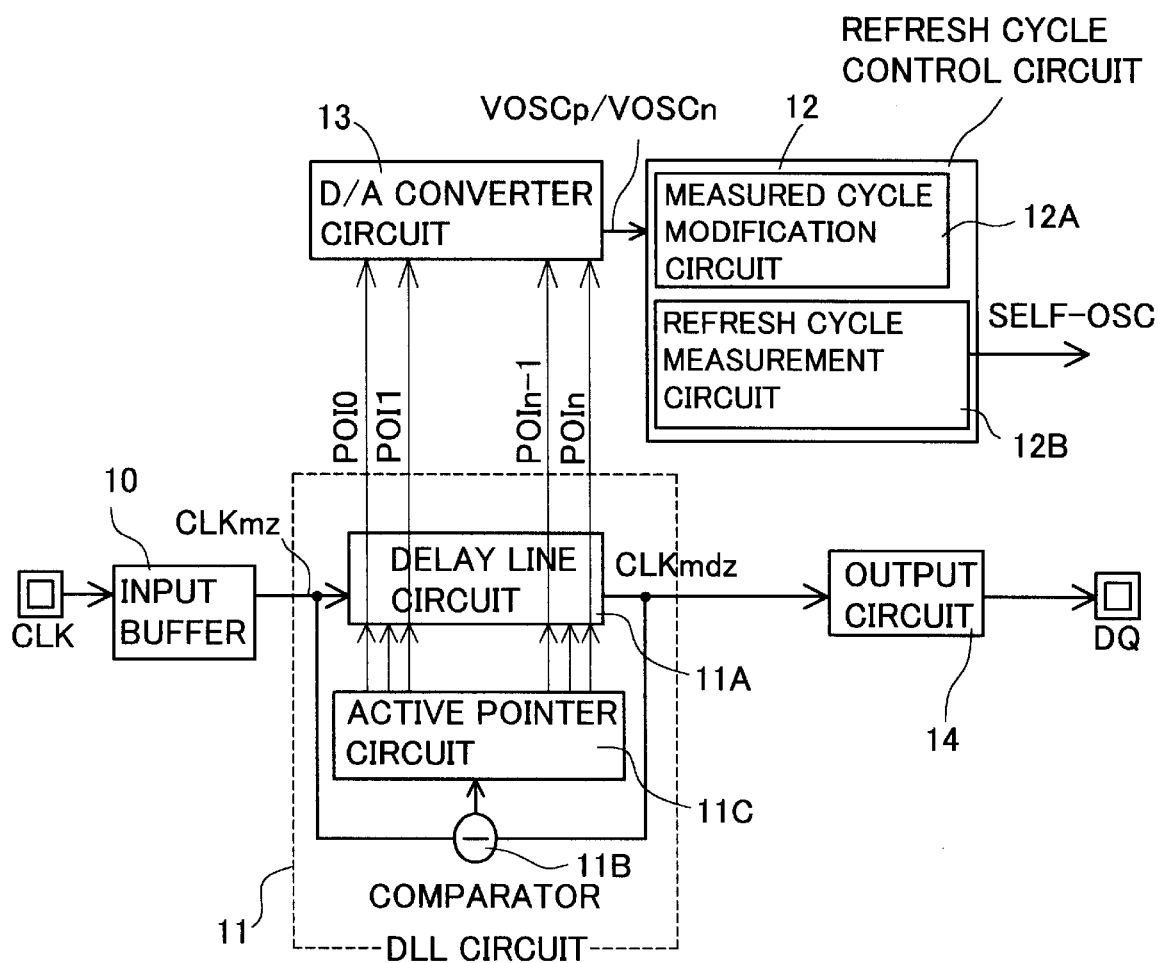
FIG. 4 is a circuit block diagram illustrating a refresh cycle setting circuit in the embodiment of the invention.

The circuit block diagram illustrating the refresh cycle setting circuit in the embodiment according to the invention in FIG. 4 shows the embodiment in which a first conversion circuit is used as a conversion circuit 3 shown in the diagram illustrating a third principle of the invention in FIG. 3. In addition, a DLL circuit 11 is used as frequency detection circuit 1. Signals POI0 to POIn, the phase comparison signals from the DLL circuit 11, are output from an active pointer circuit 11c as digital signals. The digital signals POI0 to POIn output from the active pointer circuit 11c are input to a D/A converter circuit 13, which outputs analog signals (the voltage value) VOSCp/VOSCn for determining the current value of constant current source circuits. A measured cycle modification circuit 12A in a refresh cycle control circuit 12, which receives the signals VOSCp/VOSCn, constitutes constant current source circuits (MP, MN in FIG. 8) which output the current value responsive to the voltage value of VOSCp/VOSCn. Using the constant current, the driving capability of a refresh cycle measurement circuit 12B (RO in FIG. 8) is controlled, and thus, an oscillation signal for refreshing SELF-OSC is output.

Hereinafter, each configuration will be described in detail. After being received by an input buffer 10, an external basic clock CLK is input to a delay line circuit 11A in the DLL circuit 11 as a signal CLKmz. The delay line circuit 11A is configured such that delay gate circuits are multi-stage connected in series. The delay line circuit 11A adjusts delay amount by controlling the number of stages of the delay gate circuits to which the signal CLKmz is propagated by circuit of the output signals POI0 to POIn from the active pointer circuit 11C described later, and thus, synchronizes the phases of an internal basic clock CLKmdz, the output signal from the delay line circuit 11A, and an output signal CLKmz from the input buffer 10. At the same time, the delay line circuit 11A detects the frequencies of both clock signals CLKmz and CLKmdz. The internal basic clock CLKmdz is used, for example, to output data in synchronization with the external basic clock CLK to a DQ pin when supplied to an output circuit 14. The internal clock signal is effective for maintaining a synchronous operation when the speed of the external basic clock CLK is increased further.

The phases of the input and output signals CLKmz, CLKmdz of the delay line circuit 11A are compared by a comparator 11B, and phase comparison signals PSRE, PSLE, PSRO, and PSLO responsive to the difference between the phases are output to the active pointer circuit 11C. The active pointer circuit 11C outputs the signals POI0 to POIk (0<k≦n) as signals with a high logical signal level, and the signals POIk to POIn as signals with a low logical signal level. It also sets the delay amount in the delay line circuit 11A based on the signals POIk, POIk+1 showing dividing points between different logical levels. For example, if the small delay amount in the delay line circuit 11A is set for large k value, the phase comparison signals PSRE, PSLE, PSRO, and PSLO are output so that the number of the signals POI0 to POIk with the high logical level output from the active pointer circuit 11C may be increased (k value may become large), when the clock signals CLKmz and CLKmdz are of high frequencies.

The phase comparison signals PSRE, PSLE, PSRO, and PSLO adjust in the active pointer circuit 11c the signals POIk and POIk+1 showing the dividing points between logical levels of the output signals POI0 to POIn, according to the difference between the phases of the clock signals CLKmz and CLKmdz.

Figure 5:
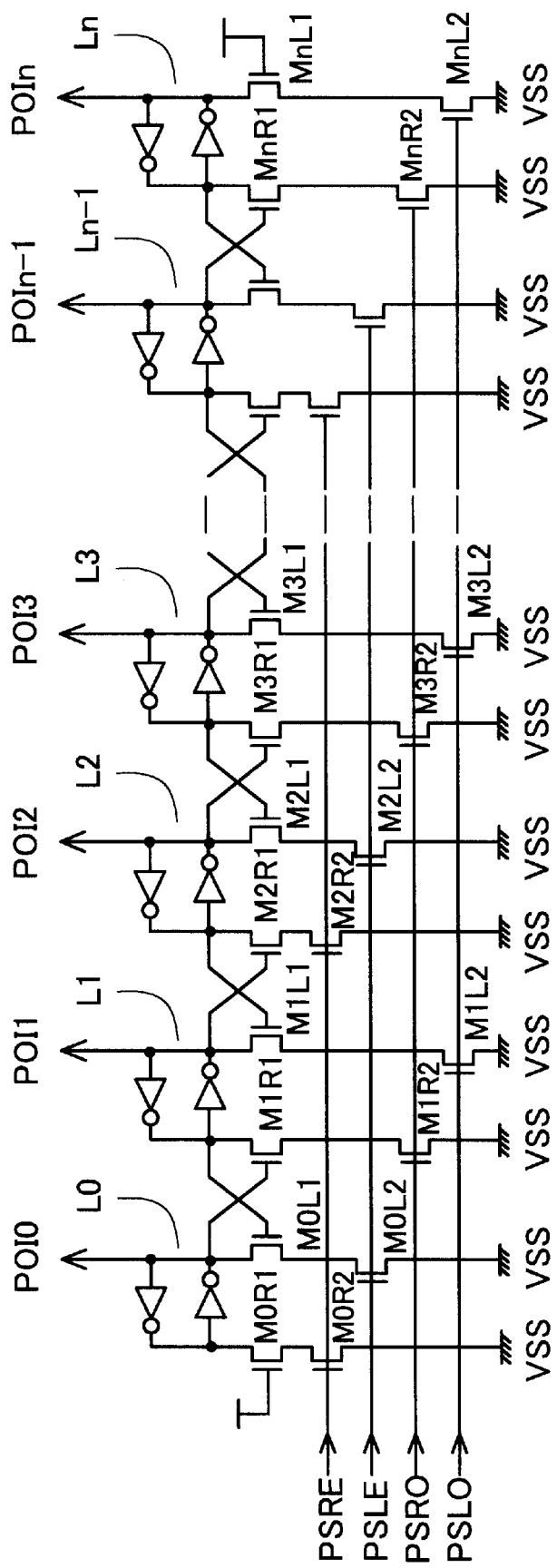
FIG. 5 is a circuit diagram illustrating an active pointer circuit in the embodiment of the invention.
Figure 6:
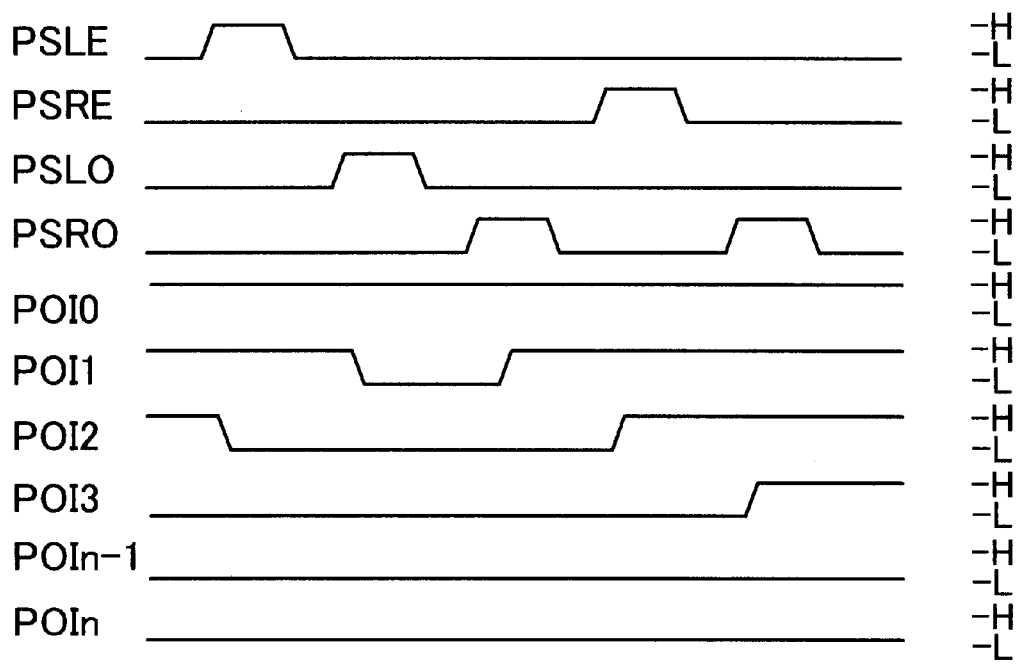
FIG. 6 shows operating wave patterns of the active pointer circuit.

Referring to FIG. 5 and FIG. 6, the operation for setting the specific signals POIk and POIk+1 will be described. First, the configuration of the active pointer circuit 11C will be described with reference to FIG. 5. Latch circuits L0 to Ln for logical levels of the output signals POI0 to POIn are connected in series with first and second NMOS transistor switches MkR1 and MkR2, MkL1 and MkL2 (k=0 to n) for connecting the output signals POI0 to POIn from respective latch circuits L0 to Ln and their inversion signals to ground terminals VSS.

Among the first and the second NMOS transistor switches MkR1 and MkR2, MkL1 and MkL2 (k=0 to n), each first NMOS transistor MkL1 (k=0 to n) has a drain terminal connected with the output signal POI0 to POIn node of each latch circuit L0 to Ln, a gate terminal connected with the inversion signal node of the latch circuit at the next stage, and a source terminal connected with the drain terminal of each second NMOS transistor MkL2 (k=0 to n). Similarly, each first NMOS transistor MkR1 (k=0 to n) is connected with the inversion signal node of each latch circuit L0 to Ln, its gate terminal is connected with the output signal POI0 to POIn node of the latch circuit at the previous stage, and its source terminal is connected with the drain terminal of each second NMOS transistor MkR2 (k=0 to n).

Each of the second NMOS transistors MkL2, MkR2 (k=0 to n) has a source terminal connected with the ground terminal VSS. Furthermore, each second NMOS transistor MiL2 (i=an even number not less than 0) is connected with the output signal POIi (i=an even number not less than 0) node of each latch circuit Li (i=an even number not less than 0) at an even number stage, and its gate terminal is connected with the phase comparison signal PSLE. Each second NMOS transistor MiR2 (i=an even number not less than 0) is connected with the inversion signal node of each latch circuit Li (i=an even number not less than 0) at an even number stage, and its gate terminal is connected with the phase comparison signal PSRE.

Similarly, each second NMOS transistor MjL2 (j=an odd number not less than 1) is connected with the output signal POIj (j=an odd number not less than 1) node of each latch circuit Lj (j=an odd number not less than 1) at an odd number stage, and its gate terminal is connected with the phase comparison signal PSLO. Each second NMOS transistor MjR2 (j=an odd number not less than 1) is connected with the inversion signal node of each latch circuit Lj (j=an odd number not less than 1) at an odd number stage, and its gate terminal is connected with the phase comparison signal PSRO.

Next, referring to FIG. 6, the operation of the active pointer circuit 11C will be described. In FIG. 6, it is presumed that the logical level of the output signals POI0–POI2 is high and the logical level of POI3–POIn is low as an initial state. When the phase comparison signal PSLE is input in this state, the second NMOS transistors MiL2 (i=an even number not less than 0) connected with the output signal nodes of the circuits Li (i=an even number not less than 0) at even number stages are activated. Among the first NMOS transistors, the first NMOS transistors MmL1 (m=2 to n) which receive the inversion signals from the latch circuits L3–Ln are active at this point. Consequently, the output signals POI2–POIn are connected to the ground terminals VSS, and the logical level of the lowest order output signal POI2 is inverted from high to low. In other words, the dividing point between different logical levels of the output signals in the active pointer circuit 11C is shifted toward a lower order by just 1 bit due to the input of the phase comparison signal PSLE.

During the next cycle, the phase comparison signal PSLO is input. In this case, the second NMOS transistors MjL2 (j=an odd number not less than 1) connected with the output signal node of the circuits Lj (j=an odd number not less than 1) at odd number stages are activated. Among the first NMOS transistors, the first NMOS transistors MmL1 (m=1–n) which receive the inversion signals from the latch circuits L2–Ln are active. Therefore, the output signals POI1–POIn are connected to the ground terminals VSS, and the logical level of the lowest order output signal POI1 is inverted from high to low. In other words, the dividing point between different logical levels of the output signals in the active pointer circuit 11C is shifted toward a lower order by just 1 bit due to the input of the phase comparison signal PSLO.

Furthermore, when the phase comparison signal PSRO is input during the next cycle, the second NMOS transistors MjR2 (j=an odd number not less than 1) connected with the inversion signal nodes of the latch circuits Lj (j=an odd number not less than 1) at odd number stages are activated. Among the first NMOS transistors, only the first NMOS transistor M1R1 which receives the output signal POI0 from the latch circuit L0 is active. Consequently, the inversion output node of the latch circuit L1 is connected to the ground terminal, and the logical level of the output signal POI1 is inverted from low to high. In other words, the dividing point between different logical levels of the output signals in the active pointer circuit 11C is shifted toward a higher order by just 1 bit due to the input of the phase comparison signal PSRO.

Subsequently, when the phase comparison signal PSRE is input during the next cycle, the second NMOS transistors MiR2 (i=an even number not less than 0) connected with the inversion signal nodes of the latch circuits Li (i=an even number not less than 0) at even number stages are activated. Since the first NMOS transistors MmL1 (m=0 to 2) which receive the output signals POI0, POI1 from the latch circuits L0, L1 are active, the inversion output nodes of the latch circuits Li (i=0, 2) are connected to the ground terminals VSS, and the logical level of the output signal POI2 is inverted from low to high. In other words, the dividing point between different logical levels of the output signals in the active pointer circuit 11C is shifted toward a higher order by just 1 bit.

When the phase comparison signal PSRO is additionally input, the dividing point between different logical levels of the output signals in the active pointer circuit 11C is shifted to a higher position by additional 1 bit. In other words, the phase comparison signals PSRE, PSRO shift the dividing point between logical levels of the output signals toward a higher order by 1 bit respectively, and the phase comparison signals PSLE, PSLO shift the dividing point between different logical levels of the output signals toward a lower order by 1 bit respectively.

Because of the configurations of a D/A converter circuit 13 and a refresh cycle control circuit 12 described later, the refresh cycle becomes shorter in proportion to the number of the output signals with the high logical level in the active pointer circuit 11C. Therefore, when the external basic clock CLK is of high frequency, the predetermined number of pulses of the phase comparison signals PSRE, PSRO are input to shift the dividing point between different logical levels of the output signals in the active pointer circuit 11C toward a higher order. When the external basic clock CLK is of low frequency, the predetermined number of pulses of the phase comparison signals PSLE, PSLO are input to shift the dividing point between logical levels of the output signals in the active pointer circuit 11C toward a lower order.

The output signals POI0 to POIn from the active pointer circuit 11C, which are the frequency detection signal of the external basic clock CLK detected in the DLL circuit 11, are digital signals. Therefore, these signals POI0 to POIn need to be converted to analog signals in order to control the refresh cycle control circuit 12 which is analog-controlled as described below.

This operation will be described with reference to a D/A converter circuit 13 shown in FIG. 7.

The D/A converter circuit 13 shown in FIG. 7 outputs gate bias voltage VOSCp, VOSCn for constant current source circuits MP, MN (shown in FIG. 8) to supply a current value, as driving current for the refresh cycle control circuit 12 described later, which changes in proportion to the number of the output signals with the high logical level in the active pointer circuit 11C. A PMOS transistor MP1 is a transistor for setting current to set the gate bias voltage VOSCp supplied for each constant current source circuit MP (shown in FIG. 8) to output source driving current from the power supply voltage gate. Its drain terminal receives the current value generated by the current setting circuits CS0 to CSn, the current value being responsive to the number of the signals with the high logical level among the digital signals POI0 to POIn.

Figure 9:
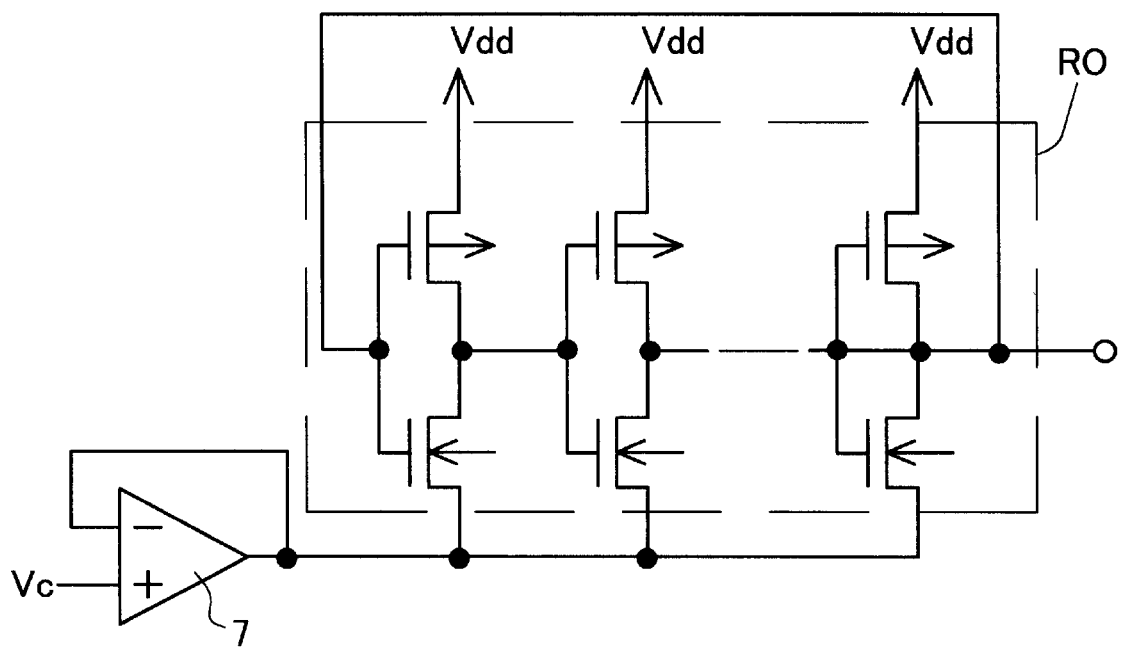
FIG. 9 is a circuit diagram illustrating a second example of the refresh cycle control circuit.

A PMOS transistor MP2 constituting the constant current source circuit with a PMOS transistor MP1 inverts the direction of the current which is generated by the current setting circuits CS0 to CSn, and is input to the PMOS transistor MP1, in order to supply the current as sink driving current. The current output from the PMOS transistor MP2 is input to a NMOS transistor MN1 via a NMOS transistor MN2 for limiting current. The NMOS transistor MN1 is a transistor for setting current to set the gate bias voltage VOSCn supplied for each constant current source circuit MN (shown in FIG. 9) to output sink driving current to the ground terminals VSS.

The current setting circuits CS0 to CSn are connected to the ground terminals VSS through the NMOS transistors for limiting current in which a permissible current value is variable-controlled according to the voltage value of the active signal SELF-ACTIVE, and the NMOS transistors whose gate terminal receives the digital signals POI0 to POIn from the active pointer circuit 11C. Among the NMOS transistors receiving the digital signals POI0 to POIn, the NMOS transistors which receive the digital signals with the high logical level are activated. Consequently, the current limited by the NMOS transistors for limiting current is flown to the appropriate current setting circuits CS0 to CSn, and the sum current becomes the current in the PMOS transistor MP1. This circuit that the PMOS transistor MP1 receives the current in proportion to the number of the signals with the high logical level among the digital signals POI0 to POIn.

Figure 7:
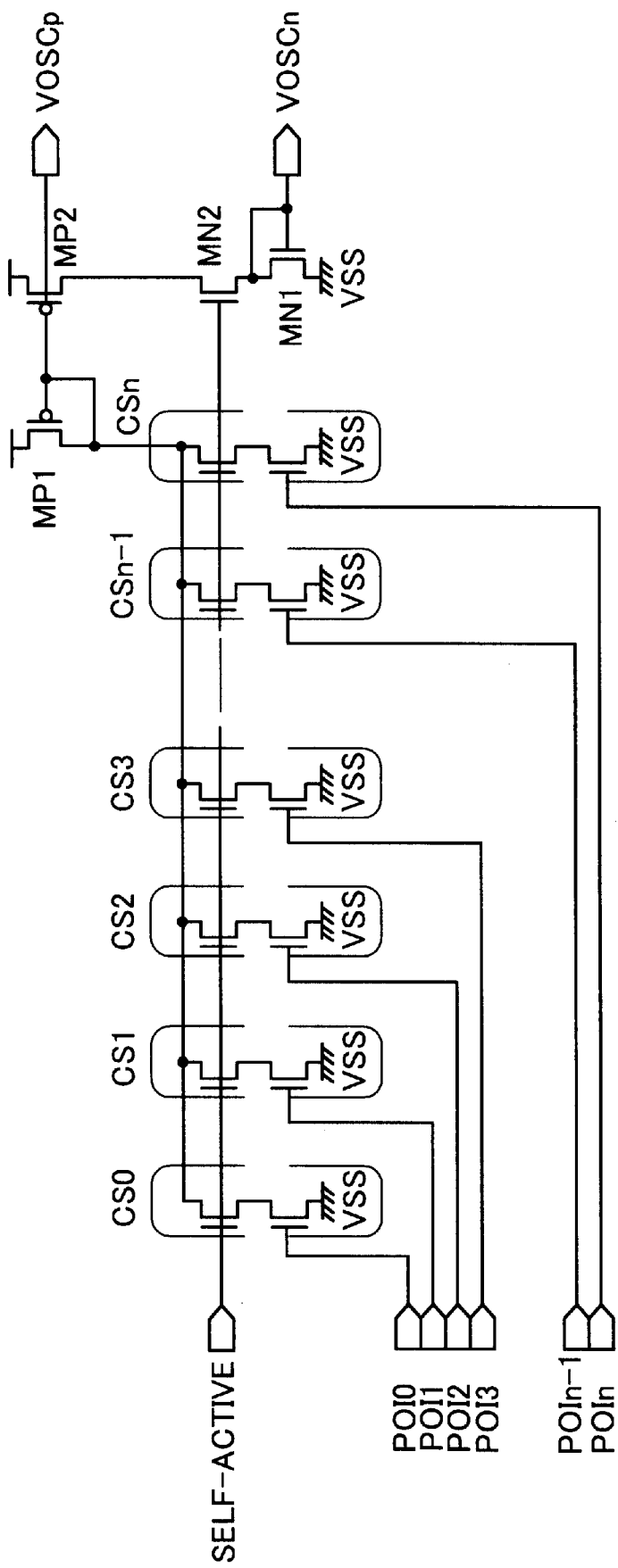
FIG. 7 is a circuit diagram illustrating D/A converter circuit in the embodiment of the invention.
Figure 8:
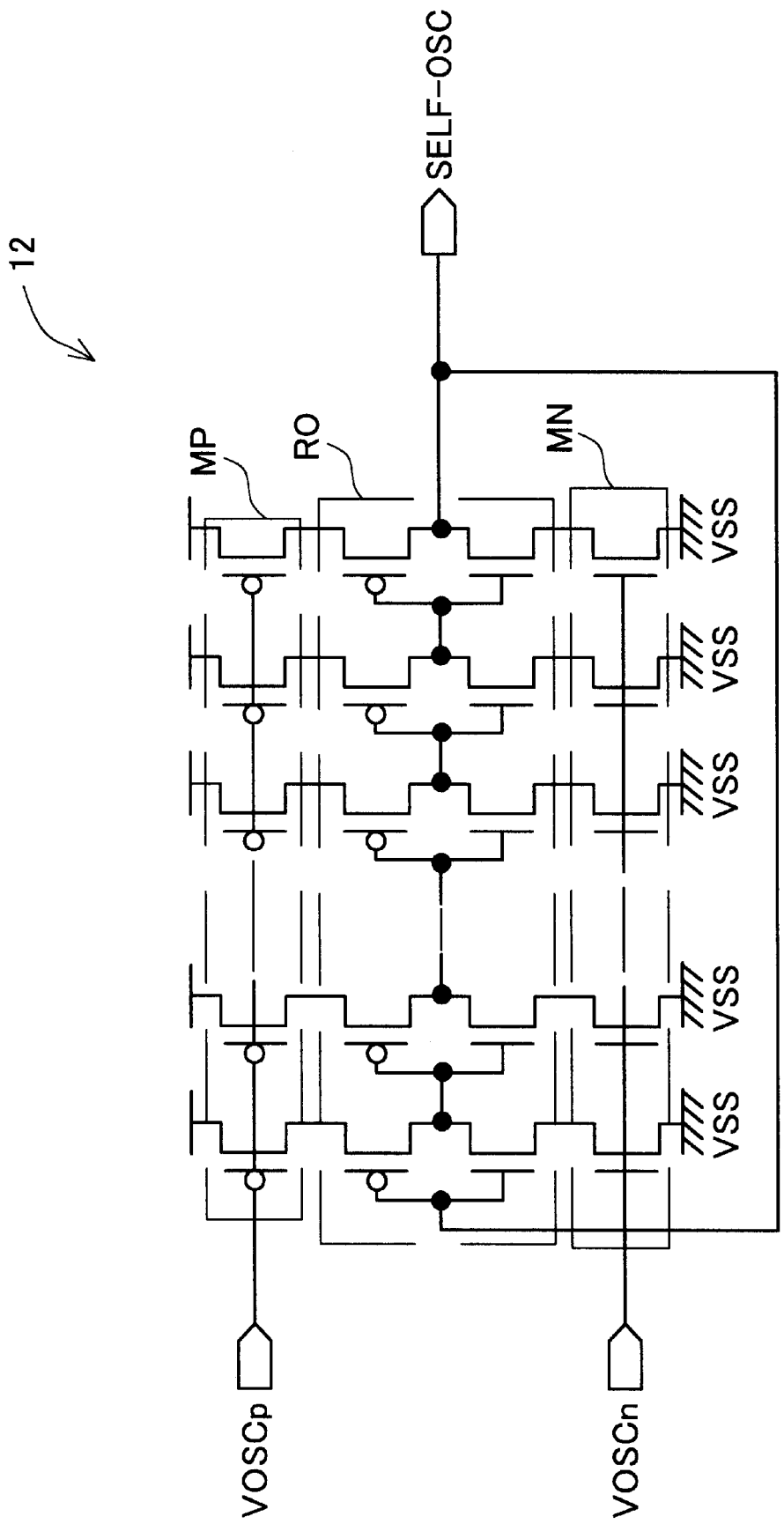
FIG. 8 is a circuit diagram illustrating a refresh cycle control circuit in the embodiment of the invention (a first example).

The frequency detection signal, which is converted from digital to analog by the D/A converter circuit 13 shown in FIG. 7, is input to the refresh cycle control circuit 12 shown in FIG. 8 as the analog signals VOSCp, VOSCn.

In the configuration of the refresh cycle control circuit 12, an oscillation circuit portion RO in which inverter logical gate circuits at odd number stages are connected in a loop-shape is used as a refresh cycle measurement circuit 12B, and the oscillation signal SELF-OSC oscillating in the cycle responsive to the gate delay time of the oscillation circuit is used as a source signal of the refresh cycle.

The source terminals of the PMOS transistor and the NMOS transistor in each inverter logical gate circuit in the oscillation circuit portion RO are connected with the power supply voltage and the ground terminal VSS via the PMOS transistor constituting MP, and the NMOS transistor constituting MN, respectively. The gate terminals of the PMOS transistors constituting MP are connected with the analog signal VOSCp, and constitute the constant current source circuit with the PMOS transistor MP1. The gate terminals of the NMOS transistors constituting MN are connected with the analog signal VOSCn, and constitute the constant current source circuit with the NMOS transistor MN1. Thus, the driving current value for each inverter logical gate circuit in the oscillation circuit portion RO is defined. Therefore, the propagation delay time of the inverter logical gate circuits is controlled according to the driving current value, and thus, the cycle of the oscillation circuit portion RO is controlled, and accordingly, the refresh cycle is controlled.

In the aforementioned embodiment, when the DLL circuit 11 is used as the frequency detection circuit 1 to output the digital signals POI0 to POIn as the frequency detection signal A, the D/A converter circuit 13 is used as the conversion circuit 3 to convert the signals in order to input the current value setting voltage, the analog signals VOSCp, VOSCn as the input signal B to the refresh cycle control circuit 12 as the refresh cycle control circuit 2 where the driving current value is controlled. So far, the frequency detection circuit 1 and the refresh cycle control circuit 2 to be interfaced with each other have been described in detail.

Various circuit systems have been conventionally proposed for the frequency detection circuit 1 and the refresh cycle control circuit 2 separately. When the interface signals of the aforementioned circuit are different, both the circuit with various circuit systems can be organically combined and associated with each other if the conversion circuit 3 is added as needed. Thus it is possible to implement this invention by combining organically and associating both the circuit with various circuit systems.

Hereinafter, the example of each circuit system will be described. First, as the other example, a second example of the refresh cycle control circuit 2 will be described with reference to FIG. 9. The oscillation circuit portion RO has the same configuration as in the first example shown in FIG. 8. In the second example, the control of the driving capability to control the oscillation cycle is realized by controlling the power supply voltage. In this circuit system, the voltage value at the low-voltage side terminal of the oscillation circuit portion RO is set at Vc by connecting the output terminal of the buffer circuit 7 which receives control voltage Vc to the low-voltage side terminal, and thus, the driving power supply voltage Vdd-Vc of the oscillation circuit portion RO is controlled by enabling changes in the control voltage Vc. The refresh cycle control circuit in the second example is a known circuit system disclosed in the Japanese Laid-Open Patent Publication No.6-21776.

Figure 10:
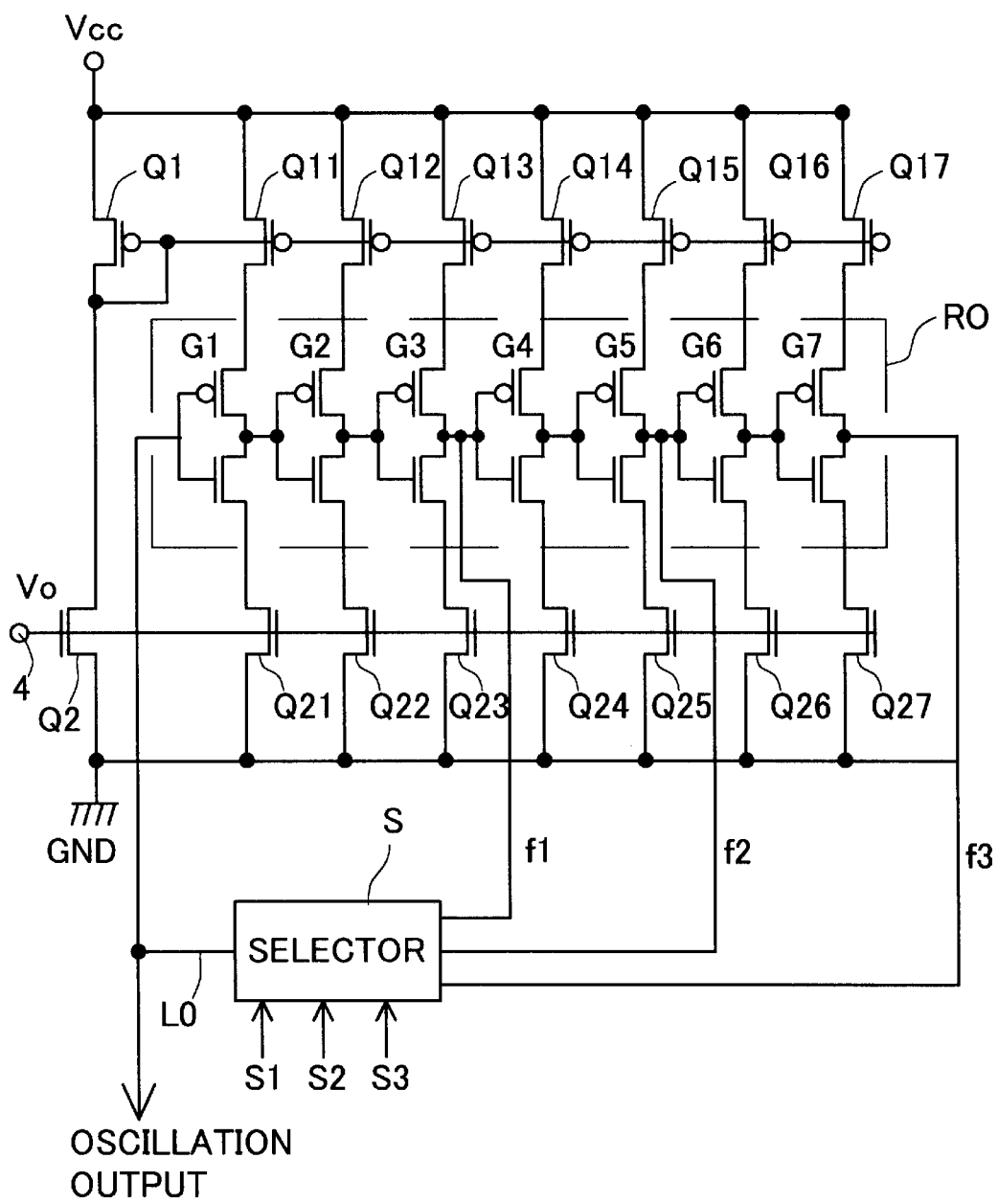
FIG. 10 is a circuit diagram illustrating a third example of the refresh cycle control circuit.

In a third example shown in FIG. 10, the oscillation circuit in which driving current is controlled has the same configuration as in the first example shown in FIG. 8. In the third example, the oscillation cycle can be changed by switching the number of stages in the loop in the oscillation circuit portion RO by circuit of a selector S. Switching is done by signals S1–S3 input to the selector S. Specifically, the selector S may be configured such that opening and closing of switches for forming the loop in the oscillation circuit is performed by the digital signals S1–S3. The refresh cycle control circuit in the third example is a known circuit system disclosed in the Japanese Laid-Open Patent Publication No.7-254847.

Figure 11:
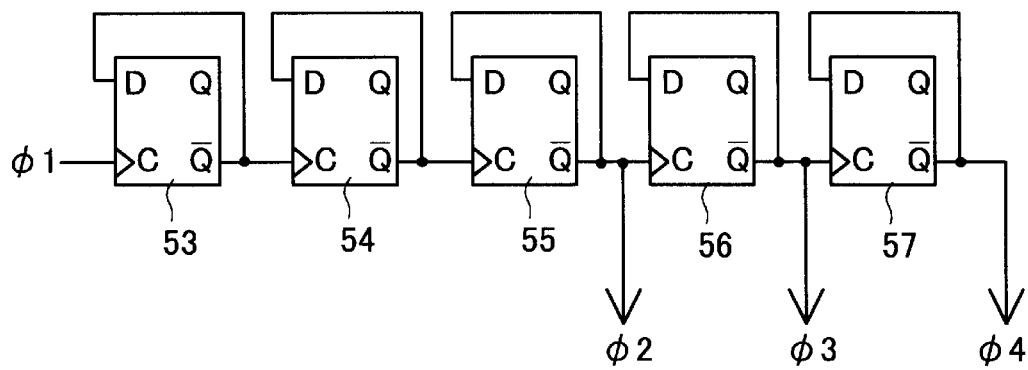
FIG. 11 is a circuit diagram illustrating a fourth example of the refresh cycle control circuit.

A fourth example is shown in FIG. 11. In this example, a frequency division circuit is configured by connecting D type flip-flop circuits in series. An oscillation signal from the oscillation circuit (not illustrated) is input to the initial stage as a input signal $\phi 1$, and oscillation signals $\phi 2$, $\phi 3$, $\phi 4$ which are frequency-divided at the predetermined frequency division ratio are selected as appropriate. The frequency-divided signals $\phi 2$, $\phi 3$, $\phi 4$ can be selected by a select circuit (not illustrated). An ordinary select circuit may also be used besides the selector S in the third example. The refresh cycle control circuit in the fourth example is a known circuit system disclosed in the Japanese Laid-Open Patent Publication No.4-313888.

Figure 12:
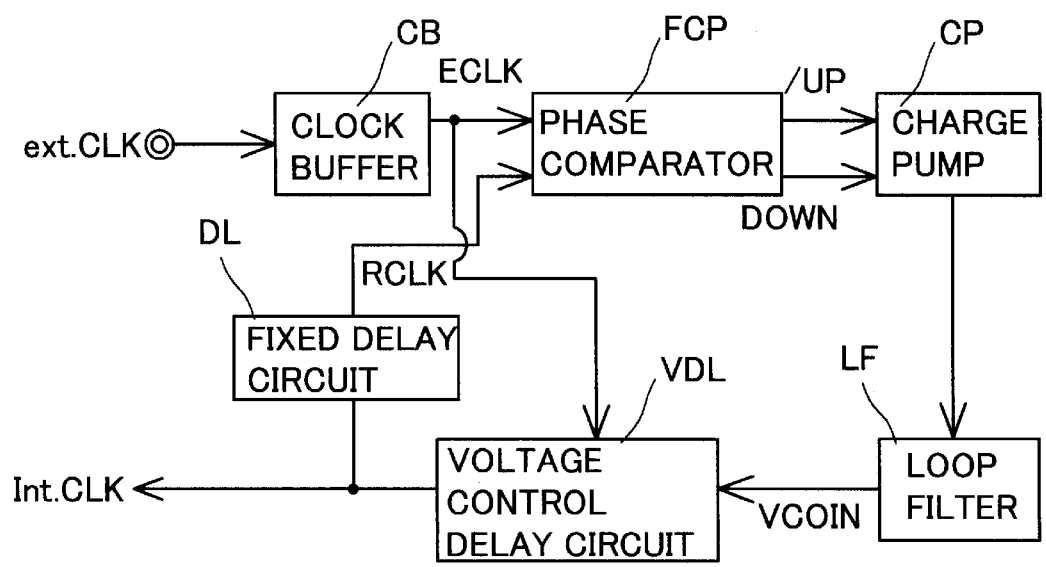
FIG. 12 is a circuit block diagram illustrating the other example of a DLL circuit.

Next, another example of the frequency detection circuit will be described. FIG. 12 shows another example of the DLL circuit which is analog-controlled. This circuit comprises a clock buffer CB, a phase comparator FCP, a charge pump CP, a loop filter LF, a voltage control delay circuit VDL, and a fixed delay circuit DL. In this circuit, the clock buffer CB outputs a buffered external clock signal ext. CLK as a clock signal ECLK, the phase comparator FCP compares the phase of the signal ECLK with that of a clock signal RCLK generated from an internal clock signal int. CLK. The charge pump CP receives signals/UP, DOWN as the result of phase comparison, and outputs voltage. The loop filter LF supplies a smoothed analog control signal VOIN to a voltage controlled delay circuit VDL, where the frequency of the internal clock signal int. CLK is adjusted.

Figure 13:
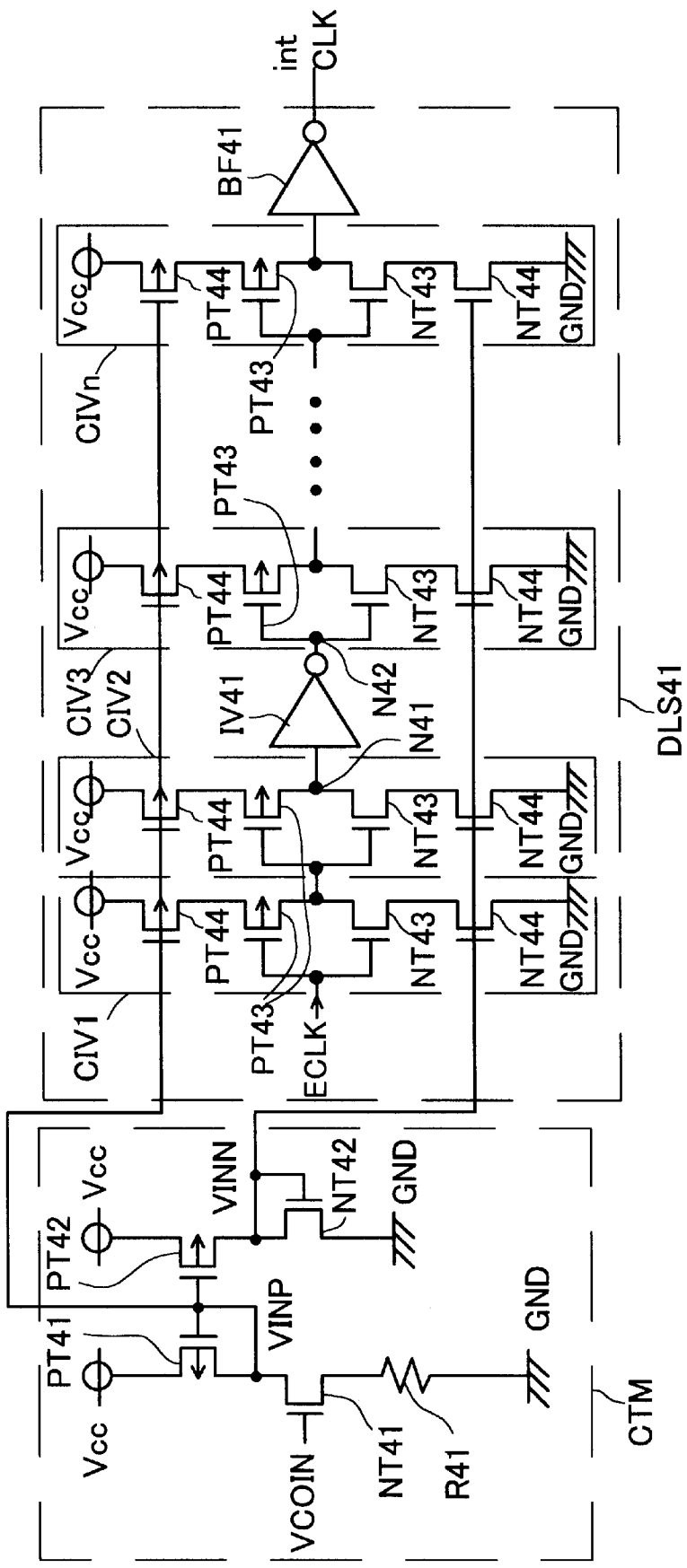
FIG. 13 is a circuit diagram illustrating a voltage control delay circuit in the other example of the DLL circuit.

In FIG. 13, there is shown an configuration example of the voltage control delay circuit VDL. Due to the input of the analog control signal VCOIN, a NMOS transistor NT41 which operates as a voltage control resistor adjusts the current value of a constant current source circuit for supplying source current composed of PMOS transistors PT41, PT44, and the current value of a constant current source circuit for supplying sink current composed of NMOS transistors NT42, NT44. Thus, the gate propagation delay time in each inversion circuit CIV1–CIVn in the delay circuit DLS 41 is adjusted, and DLL operation is performed. Consequently, in another example of the DLL circuit, delay time is adjusted by the analog control signal VCOIN.

Figure 14:
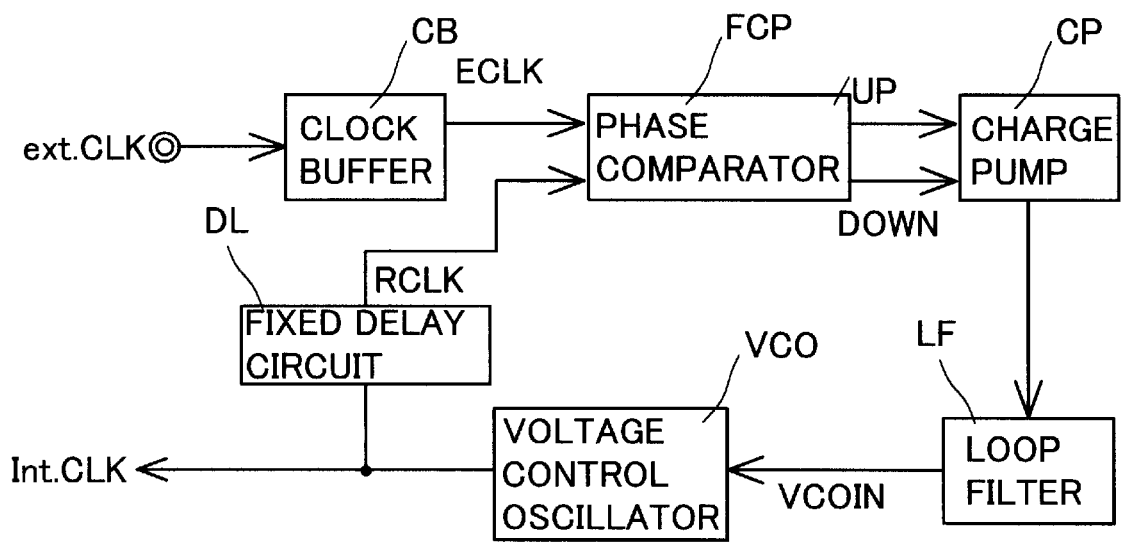
FIG. 14 is a circuit block diagram illustrating an example of a PLL circuit.

In addition, a PLL circuit may be used as frequency detection circuit. In FIG. 14, an analog-controlled PLL circuit is shown. This circuit comprises a clock buffer CB, a phase comprator FCP, a charge pump CP, a loop filter LF, a voltage control oscillator VCO, and a fixed delay circuit DL. They perform the same operations as in the other example of the DLL circuit (See FIG. 12), except the voltage control oscillator VCO. The description of the voltage control oscillator VCO will be omitted, because it is an ordinary circuit.

Therefore, delay time is adjusted by the analog control signal VCOIN also in this PLL circuit. This frequency detection circuit 1 is a known circuit system disclosed in the Japanese Laid-Open Patent Publication No.2000-196444. If a digital PLL circuit is used, delay time is controlled by a digital control signal.

This invention may be implemented also by combining the aforementioned frequency detection circuit 1 and the refresh cycle control circuit 2, as appropriate.

In other words, in order to combine the DLL circuit 11 which outputs digital signals POI0 to POIn with the refresh cycle control circuit (FIG. 9) which receives the analog signal as the control voltage Vc, a D/A converter may be used as a conversion circuit 3 to convert the digital signals POI0 to POIn to the analog signal as the control voltage Vc.

In order to combine the DLL circuit 11 which outputs the digital signals POI0 to POIn with the refresh cycle control circuit (FIGS. 10, 11) which receives the digital select signals (S1–S3 in FIG. 10, not illustrated in FIG. 11), a decoder circuit may be used as a conversion circuit 3 to convert the digital signals POI0 to POIn to the select signals.

Additionally, in order to combine the DLL circuit which has the analog control signal VCOIN (FIG. 12) with the refresh cycle control circuit 12 which receives the analog signal as the current setting voltage VOSCp, VOSCn, or the refresh cycle control circuit which receives the analog signal as the control voltage Vc (FIG. 9), a circuit to convert the level or the voltage to current of the analog control signal VCOIN may be used as the conversion circuit 3.

Furthermore, in order to combine the DLL circuit which has the analog control signal VCOIN (FIG. 12) with the refresh cycle control circuit which receives the digital select signals (S1–S3 in FIG. 10, not illustrated in FIG. 11), an A/D converter circuit may be used as the conversion circuit 3 to convert the analog control signal VCOIN to the digital select signals.

As for the PLL circuit, circuits which use a digital signal or an analog signal as the phase comparison signal may be conceived. When these PLL circuits and the refresh cycle control circuit 2 are interfaced with each other, the same configuration may be made as in the case where the aforementioned DLL circuits are used.

As described in detail so far, in the synchronous semiconductor memory device and the refresh method thereof according to the invention, the refresh cycle can be set automatically in accordance with the charge retention characteristics of the memory cells at each device temperature which changes according to the frequency of the external clock CLK, by associating the DLL circuit (11 in FIG. 4, FIG. 12) or the PLL circuit (FIG. 14) as the frequency detection circuit 1, with the first to fourth examples of the refresh cycle control circuit (12 in FIG. 4, FIGS. 9–11) as the refresh cycle control circuit 2. Thus, it is not necessary to perform a test for measuring temperature characteristics of charge retention in memory cells to set the refresh cycle for each synchronous semiconductor memory device.

In addition, it is not required to use temperature detection circuit whose accuracy is difficult to ensure due to production variations, and it is possible to use a stable signal, the external basic clock as a temperature sensor. Thus, the refresh cycle suitable for device temperature can be set easily without fail, that is, the optimum refresh cycle can be realized automatically over a full temperature range, enabling reduction of current consumption.

Furthermore, even when the charge retention time of the memory cells is decreased as the device temperature rises due to an increase in the speed of the external basic clock CLK, the refresh cycle is shortened according to the external basic clock CLK. Therefore, even when the device temperature changes due to a change in operating frequency, a refresh operation is performed in the optimum cycle on all occasions, and the reliability with which the memory cells retain charge can be ensured easily without fail using a stable signal, the external basic clock CLK.

Additionally, the DLL circuit 11 is provided as phase comparison circuit to synchronize the frequencies and phases between the external basic clock CLK and the internal basic clock CLKcmd, and the output signals POI0 to POIn are output from the active pointer circuit 11C as the frequency detection signal according to the frequency of the external basic clock CLK. Thus, even if it is necessary to generate the internal basic clock CLKcmd having the frequency and phase in synchronization with those of the external basic clock CLK for internal operation using the DLL circuit 11 so as to ensure a high-speed synchronous operation in the synchronous semiconductor memory device in the case where the frequency of the external basic clock CLK is increased further, the frequency of the external basic clock at the time when phase comparison is made in the DLL circuit 11 can be detected as the frequency detection signal. The DLL circuit 11 may be replaced by the PLL circuit, and the frequency detection signal may be an analog signal besides an digital signal.

With regard to the interface between the DLL circuit (11 in FIG. 4, FIG. 12) or the PLL circuit (FIG. 14) as the frequency detection circuit 1 and the first to fourth examples of the refresh cycle control circuit as the refresh cycle control circuit 2, circuit systems using various forms of signals can be interfaced with each other if the D/A converter circuit 13, the other D/A converter circuit systems, a decoder circuit, a circuit to convert the level or the voltage to current of signals, or an A/D converter circuit is added as the conversion circuit 3 based on the form of output signal from the frequency detection circuit 1 and the input signal to the refresh cycle control circuit 2. Therefore, the configuration according to this invention can be implemented irrespective of circuit systems of the frequency detection circuit 1 and the refresh cycle control circuit 2.

Consequently, whether in the cases where the operating cycle of the oscillation circuit as the refresh cycle control circuit 2 is controlled by analog signals such as driving current or power supply voltage (See FIG. 8 as the circuit system using driving current, and See FIG. 9 as the circuit system using power supply voltage), or in the cases where the control is made by digital signals, that is, the number of stages in the loop in the oscillation circuit is switched (the circuit system in FIG. 10) or the frequency division ratio of the output signals from the oscillation circuit is switched (the circuit system in FIG. 11), the DLL circuit (11 in FIG. 4, FIG. 12), the PLL circuit (FIG. 14) or even the PLL circuit outputting a digital signal as the frequency detection circuit 1 may be combined with the refresh cycle control circuit 2.

According to the first example of the refresh cycle control circuit 12 as the refresh cycle control circuit 2, the PMOS transistors MP and NMOS transistors MN as the measured cycle modification circuit 12A modifies the driving current value due to the input of the analog signals VOSCp, VOSCn responsive to the frequency detection signal A. Thus, it is possible to change the cycle of the oscillation circuit portion RO as the refresh cycle measurement circuit 12B to adjust the operating cycle in accordance with the external basic clock.

It is also possible to control the operating cycle of the oscillation circuit portion RO as the refresh cycle measurement circuit 2B using analog signals such as power supply voltage.

According to the second example of the refresh cycle control circuit 2, the buffer circuit 7 as the measured cycle modification circuit 2A outputs the control voltage Vc responsive to the frequency detection signal A as the power source voltage. Thus, it is possible to change the cycle of the oscillation circuit portion RO as the refresh cycle measurement circuit 2B to adjust the operating cycle in accordance with the external basic clock.

It is also possible to control the operating cycle of the oscillation circuit portion RO as the refresh cycle measurement circuit 2B using analog signals such as power supply voltage.

According to the third example of the refresh cycle control circuit 2, the selector S as the measured cycle modification circuit 2A switches the number of stages in the loop in the oscillation circuit portion RO. Thus, it is possible to change the cycle of the oscillation circuit portion RO as the refresh cycle measurement circuit 2B to adjust the operating cycle in accordance with the external basic clock.

It is also possible to control the operating cycle of the oscillation circuit portion RO as the refresh cycle measurement circuit 2B using digital signal for switching the number of the stages in the loop in the oscillation circuit portion RO and other digital signals.

According to the fourth example of the refresh cycle control circuit 2, the select circuit (not illustrated) as the measured cycle modification circuit 2A selects as appropriate the oscillation signals φ2, φ3, φ4 which are frequency-divided at the predetermined frequency division ratio and are output from the frequency division circuit. Thus, it is possible to change the cycle in which the oscillation signals are frequency-divided by the oscillation circuit as the refresh cycle measurement circuit 2B to adjust the operating cycle in accordance with the external basic clock.

It is also possible to control the operating cycle of the oscillation circuit portion RO as the refresh cycle measurement circuit 2B using digital signal for switching the frequency division ratio in the frequency division circuit and other digital signals.

It is to be understood that the invention is not to be taken as limited to the specific embodiment herein and that various changes and modifications may be made without departing from the true spirit of the invention.

Although the particular embodiment has been shown and described with reference to the examples of the DLL and the PLL circuits as the frequency detection circuit 1, circuit systems to be employed are not limited to these DLL and PLL circuit systems. For example, it is possible to employ any circuits that can detect the frequency and cycle of the external basic clock by counting the number of edges of the external basic clock within a predetermined time period or by measuring the time period between edges.

Similarly, the refresh cycle measurement circuit 2 is not limited to the oscillation circuit. For example, it is possible to employ any circuit configurations with the feature for measuring variable time periods, such as circuit systems which control charging current according to the frequency of the external basic clock in an analog timer for measuring the period during which charging voltage reaches a predetermined potential in a predetermined condenser.

Furthermore, as for the conversion circuit 3 for interface signals, it is possible to employ circuit systems which convert a frequency or have a mapping table for an external basic clock and a refresh cycle, besides a D/A converter circuit, a A/D converter circuit, a decoder circuit, and circuit systems for converting voltage to current. Specifically, possible circuit systems include: frequency conversion circuit systems which set a refresh cycle as a frequency-divided signal of an external basic clock using a provided frequency division circuit for dividing the frequency of the external basic clock till it becomes suitable as the refresh cycle of memory cells; circuit systems which store the relationship between external basic clocks and associated refresh cycles as a mapping table, and reads an appropriate refresh cycle from the table in response to the input of an external basic clock.

The invention can provide a synchronous semiconductor memory device which provides the refresh cycle optimum for charge retention characteristics without being influenced by production variations, and without requiring much test time to measure characteristics before adjustment of the refresh time, and reduces current consumption in a refresh operation.

What is claimed is:

1. A synchronous semiconductor memory device requiring periodical refresh of memory cells, comprising:
    detection circuit for constantly detecting the frequency obtained when an internal basic clock frequency and phase of which coincide with frequency and phase of an external basic clock that is constantly input is generated, and
    cycle control circuit for controlling a refresh cycle based on a frequency detection signal output from the detection circuit.

2. The synchronous semiconductor memory device according to claim 1, wherein the cycle control circuit controls the refresh cycle such that the refresh cycle becomes shorter as the frequency of the external basic clock becomes higher.

3. The synchronous semiconductor memory device according to claim 1, wherein the cycle control circuit comprises cycle measurement circuit for measuring the refresh cycle, and a measured cycle modification circuit for enabling changes in the measured refresh cycle based on the frequency detection signal.

4. The synchronous semiconductor memory device according to claim 3, wherein the cycle measurement circuit comprises an oscillation circuit, and the measured cycle modification circuit comprises a current source circuit for enabling changes in the driving current of the oscillation circuit based on the frequency detection signal.

5. The synchronous semiconductor memory device according to claim 3, wherein the cycle measurement circuit comprises an oscillation circuit, and the measured cycle modification circuit comprises a voltage source circuit for enabling changes in the power supply voltage of the oscillation circuit based on the frequency detection signal.

6. The synchronous semiconductor memory device according to claim 3, wherein the cycle measurement circuit comprises an oscillation circuit, and the measured cycle modification circuit comprises a number-of-stage switching circuit for enabling changes in the number of odd number stages of inversion circuits connected in a loop-shape in the oscillation circuit, based on the frequency detection signal.

7. The synchronous semiconductor memory device according to claim 3, wherein the cycle measurement circuit comprises an oscillation circuit and a frequency division circuit, and the measured cycle modification circuit comprises a frequency division ratio switching circuit for enabling changes in the frequency division ratio of the frequency division ratio circuit, based on the frequency detection signal.

8. The synchronous semiconductor memory device according to claim 1, wherein the detection circuit comprises phase comparison circuit for generating an internal basic clock whose frequency and phase are in synchronization with those of an external basic clock, and the frequency detection signal is output from the phase comparison circuit.

9. The synchronous semiconductor memory device according to claim 4, further comprising a first conversion circuit for converting the frequency detection signal from digital to analog when the frequency detection signal is a digital signal.

10. The synchronous semiconductor memory device according to claim 6, further comprising a second conversion circuit for converting the frequency detection signal from analog to digital when the frequency detection signal is an analog signal.

11. A refresh method of the synchronous semiconductor memory device requiring periodical refresh of memory cells, comprising:

a detection process of constantly detecting the frequency obtained when an internal basic clock frequency and phase of which coincide with frequency and phase of an external basic clock that is constantly input is generated, and a cycle control process of controlling a refresh cycle based on a frequency detection signal output from the detection process.

12. The refresh method of the synchronous semiconductor memory device according to the claim 11, wherein the refresh cycle is controlled so as to become shorter as the frequency of the external basic clock becomes higher in the cycle control process.

13. The refresh method of the synchronous semiconductor memory device according to the claim 11, wherein the cycle control process comprises a cycle measurement process of measuring the refresh cycle, and a measured cycle modification process of enabling changes in the measured refresh cycle, based on the frequency detection signal.

14. The refresh method of the synchronous semiconductor memory device according to the claim 13, wherein the cycle measurement process comprises an oscillation process, and the measured cycle modification process comprises a current setting process of enabling changes in the current for determining the oscillation frequency in the oscillation process, based on the frequency detection signal.

15. The refresh method of the synchronous semiconductor memory device according to the claim 13, wherein the cycle measurement process comprises an oscillation process, and the measured cycle modification process comprises a voltage setting process of enabling changes in the voltage for determining the oscillation frequency in the oscillation process, based on the frequency detection signal.

16. The refresh method of the synchronous semiconductor memory device according to the claim 13, wherein the cycle measurement process comprises an oscillation process, and the measured cycle modification process comprises a switching process of enabling changes in the number of clocking processes for clocking a unit time stacked so as to determine the oscillation frequency in the oscillation process, based on the frequency detection signal.

17. The refresh method of the synchronous semiconductor memory device according to the claim 13, wherein the cycle measurement process comprises an oscillation process and an frequency division process, and the measured cycle modification process comprises a frequency division ratio switching process of enabling changes in the frequency division ratio in the frequency division process, based on the frequency detection signal.

18. The refresh method of the synchronous semiconductor memory device according to the claim 11, wherein the detection process comprises a phase comparison process of generating an internal basic clock whose frequency and phase are in synchronization with those of the external basic clock, and the frequency detection signal is output from the phase comparison process.

19. The refresh method of the synchronous semiconductor memory device according to the claim 14, further comprising a first conversion process of converting the frequency detection signal from digital to analog when the frequency detection signal is a digital signal.

20. The refresh method of the synchronous semiconductor memory device according to the claim 16, further comprising a second conversion process of converting the frequency detection signal from analog to digital when the frequency detection signal is an analog signal.

* * * * *